(12) United States Patent
Lee

(10) Patent No.: US 8,027,222 B2
(45) Date of Patent: Sep. 27, 2011

(54) BURST MODE CONTROL CIRCUIT

(75) Inventor: Kyong Ha Lee, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 125 days.

(21) Appl. No.: 12/455,727

(22) Filed: Jun. 4, 2009

(65) Prior Publication Data

US 2010/0177590 A1   Jul. 15, 2010

(30) Foreign Application Priority Data

Jan. 12, 2009 (KR) .................. 10-2009-0002256

(51) Int. Cl.
*G11C 8/00* (2006.01)

(52) U.S. Cl. .......... 365/233.18; 365/233.16; 365/233.17

(58) Field of Classification Search ............. 365/233.18, 365/233.17, 233.16
See application file for complete search history.

(56) References Cited

U.S. PATENT DOCUMENTS

| | | | | |
|---|---|---|---|---|
| 5,568,445 A | * | 10/1996 | Park et al. | 365/233.1 |
| 6,310,823 B1 | * | 10/2001 | Nam | 365/193 |
| 6,324,120 B2 | | 11/2001 | Farmwald et al. | |
| 6,771,558 B2 | * | 8/2004 | Kim | 365/233.18 |
| 7,492,658 B2 | * | 2/2009 | Oh | 365/222 |
| 7,768,852 B2 | * | 8/2010 | Yoo | 365/203 |

FOREIGN PATENT DOCUMENTS

| | | |
|---|---|---|
| KR | 10-2006-0066203 | 6/2006 |
| KR | 10-2007-0099765 | 10/2007 |

* cited by examiner

*Primary Examiner* — Pho M Luu

(74) *Attorney, Agent, or Firm* — John P. White; Cooper & Dunham LLP

(57) ABSTRACT

A burst mode control unit includes a burst period signal generation unit for generating a burst period signal which is enabled during a burst mode operation period, a burst pulse generation unit for generating a burst pulse, which is generated at every predetermined number of cycles during the enabled period of the burst period signal, in response to a read command and a write command, and a column access signal generation unit for receiving the burst signal and a clock signal and generating a column access signal which controls input and output of data during the burst mode operation period.

25 Claims, 7 Drawing Sheets

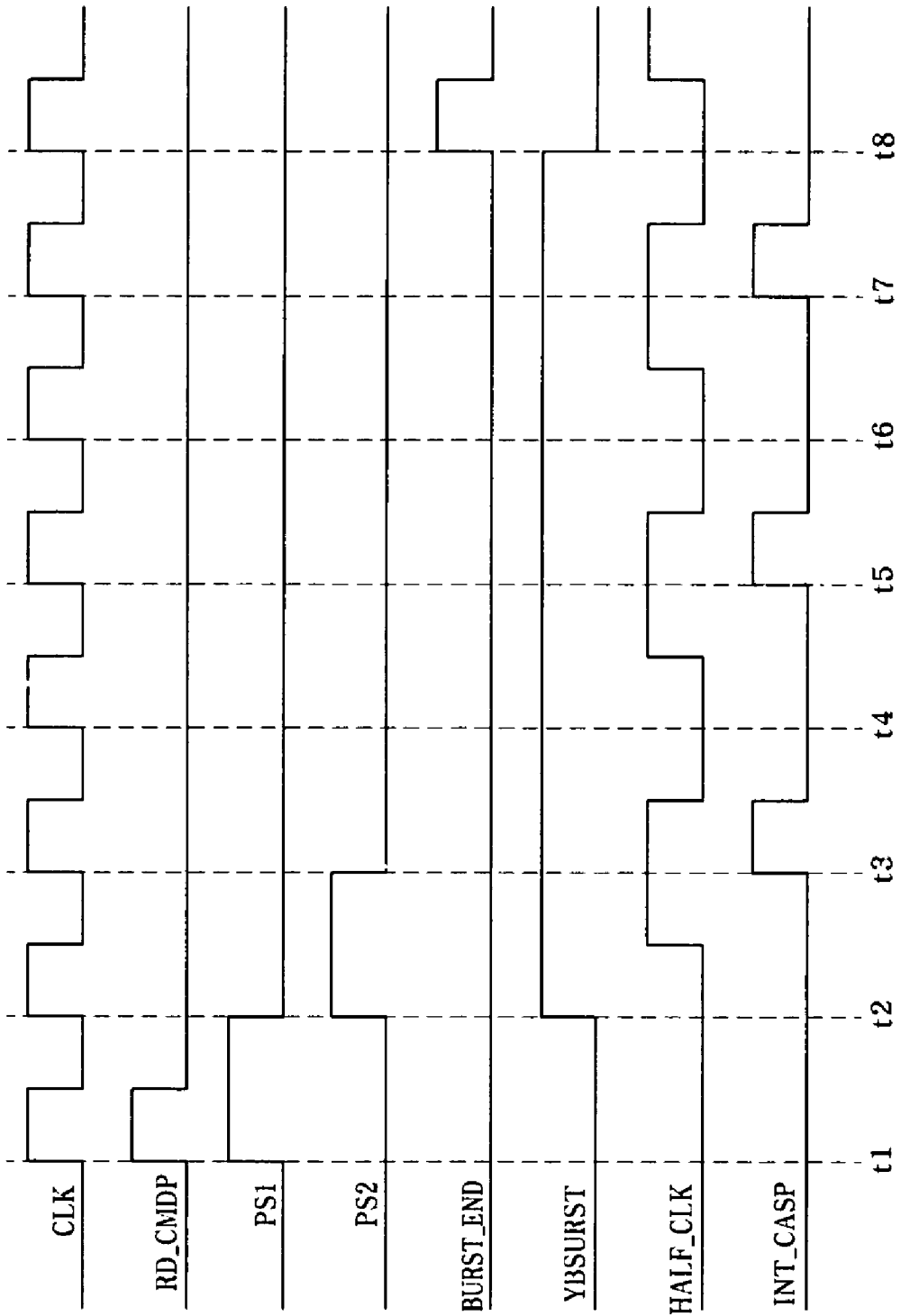

BURST MODE CONTROL CIRCUIT

TECHNICAL FIELD

The present invention relates to a semiconductor memory, and more particularly, to a burst mode control circuit capable of facilitating realization of a circuit and reducing current consumption in a LPDDR2.

BACKGROUND

As is well known, a Double Data Rate (DDR), which can input and output data in synchronization with both rising edge and falling edge of a clock upon input and output of the data, operates in a burst mode in order to effectively perform continuous read or write operations.

The burst mode is set by a first burst signal BL4 and a second burst signal BL8. When the first burst signal BL4 is set to a high level, a burst length is set to 4 and thus data of 4 bits is continuously inputted or outputted by a single command. When the second burst signal BL8 is set to a high level, the burst length is set to 8 and thus data of 8 bits is continuously inputted or outputted by a single command. In general, since the burst length is defined up to 8 in a DDR2, it is easy to realize an internal command generation circuit for providing the burst mode.

Meanwhile, there has been developed a Low Power DDR2 (LPDDR2) which can markedly improve power consumption and data transfer speed of mobile devices. The DDR2 can realize a data transfer speed of 800 Mbps, which is the highest speed in the field, at a voltage of 1.2 V, and is applied with ultra-fine process of 66 nm technology to thereby allow a mobile memory chip to be packaged to a size of 9 mm*12 mm. Since the burst length is defined up to 16 in the LPDDR2, there has been a problem that realization of a burst mode control circuit for generating a column access signal which controls a burst mode operation is quite complex. Such problem will be described with reference to FIG. 1, which shows a conventional burst mode control circuit used in LPDDR2.

A conventional burst mode control circuit shown in FIG. 1 is used when a 4-bit prefetch is applied, and includes an internal command generation unit 10, a burst pulse control unit 12 and a column access signal generation unit 14.

The internal command generation unit 10 decodes a plurality of external commands CMD<0:3> in response to a clock signal CLK to generate a read command RD_CMDP, a write command WT_CMDP and an interrupt end signal BST. The read command RD_CMDP is a pulse signal generated upon a read operation, the write command WT_CMDP is a pulse signal generated upon a write operation and the interrupt end signal BST is a level signal generated from a pulse signal to pause the burst mode by an interrupt.

The burst pulse control unit 12 controls a pulse number of a burst pulse YBURSYP according to a first burst signal BL4 and a second burst signal BL8 when a pulse of the read command RD_CMDP is inputted upon the read operation or a pulse of the write command WT_CMDP is inputted upon the write operation. More specifically, the pulse of the burst pulse YBURSTP is not generated when the burst length is set to 4 and only the first burst signal BL4 is thus at a high level, the burst pulse YBURSTP is generated in one pulse when the burst length is set to 8 and only the second burst signal BL8 is thus at a high level, and the burst pulse YBURSTP is generated in three pulses when the burst length is set to 16 and both the first burst signal BL4 and the second burst signal BL8 are at a low level.

The column access signal generation signal 14 generates a column access signal INT_CASP from the burst pulse YBURSTP in synchronization with the clock signal CLK. Like the burst pulse YBURSTP, the column access signal INT_CASP is not generated as a pulse when the burst length is set to 4, is generated in one pulse when the burst length is 8, and is generated in three pulses when the burst length is 16. The burst mode is carried out when the column access signal INT_CASP is generated as such and this is because 4-bit data is basically inputted or outputted in the case that the 4-bit prefetch is applied and 4-bit data is inputted or outputted each time a pulse of the column access signal INT_CASP is generated.

Since the burst pulse control unit 12 included in the conventional burst mode control circuit configured as described above includes three clock shifters in order to provide a burst mode in which the burst length is set to 16, there has been a problem that realization of the circuit is quite complex and current consumption is very large.

SUMMARY

In an aspect of this disclosure, there is provided a burst mode control circuit having a reduced number of clock shifters used to generate pulses periodically in a burst operation period, thereby capable of facilitating circuit realization and reducing current consumption in LPDDR2.

In an embodiment, a burst mode control unit includes a burst period signal generation unit for generating a burst period signal which is enabled during a burst mode operation period, a burst pulse generation unit for generating a burst pulse, which is generated at every predetermined number of cycles during the enabled period of the burst period signal, in response to a read command and a write command, and a column access signal generation unit for receiving the burst signal and a clock signal and generating a column access signal which controls input and output of data during the burst mode operation period.

In another embodiment, a burst mode control unit includes a burst pulse generation unit for generating a burst pulse, which includes a pulse generated at every predetermined number of cycles during a burst mode operation period, and a column access signal generation unit for receiving the burst signal and a clock signal and generating a column access signal which controls input and output of data during the burst mode operation period.

BRIEF DESCRIPTION OF THE DRAWINGS

The above and other aspects, features and other advantages will be more clearly understood from the following detailed description taken in conjunction with the accompanying drawings, in which:

FIG. 7 is a timing diagram illustrating an operation of the burst mode control circuit of FIG. 2.

DESCRIPTION OF PREFERRED EMBODIMENTS

Hereinafter, embodiments of the present invention will be described with reference to accompanying drawings. However, the embodiments are for illustrative purposes only and are not intend to limit the scope of the invention.

Figure 1:
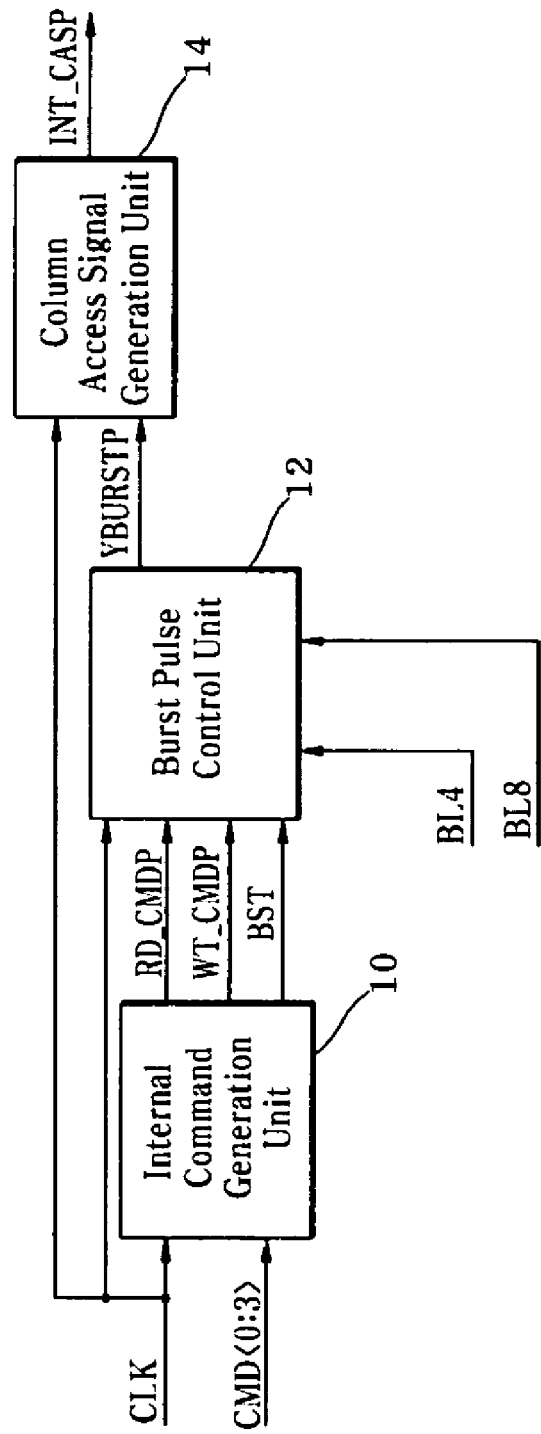
FIG. 1 is a block diagram showing a configuration of a conventional burst mode control circuit.
Figure 2:
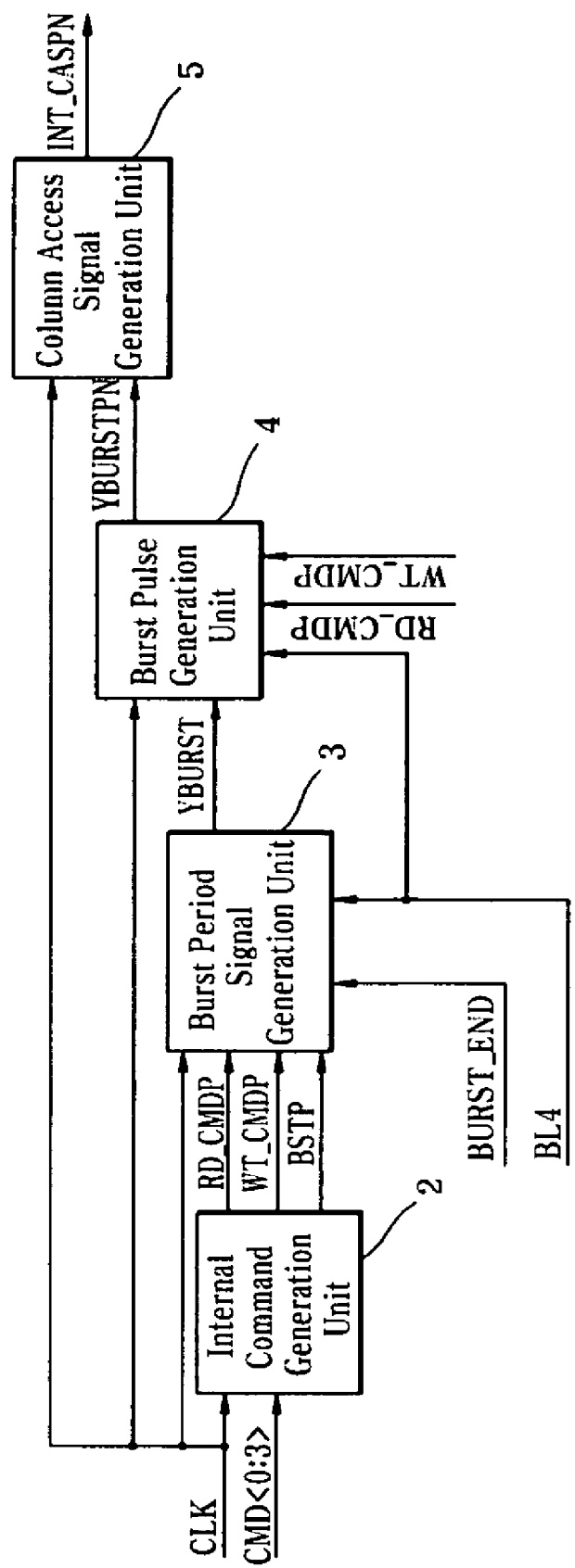
FIG. 2 is a diagram illustrating a configuration of a burst mode control circuit in accordance with an embodiment of the present invention.

FIG. 2 is a diagram illustrating a configuration of a burst mode control circuit in accordance with an embodiment of the present invention As shown in FIG. 2, a burst mode control circuit of the present embodiment includes an internal command generation unit 2, a burst period signal generation unit 3, a burst pulse generation unit 4 and a column access signal generation unit 5.

The internal command generation unit 2 decodes a plurality of external commands CMD<0:3> in response to a clock signal CLK to generate a read command RDCMDP, a write command WT_CMDP and an interrupt end pulse BSTP. The internal command generation unit 2, unlike the conventional one, outputs a pulse signal, as it is, generated to pause a burst mode by an interrupt as the interrupt end pulse BSTP without conversion into a level signal.

Figure 3:
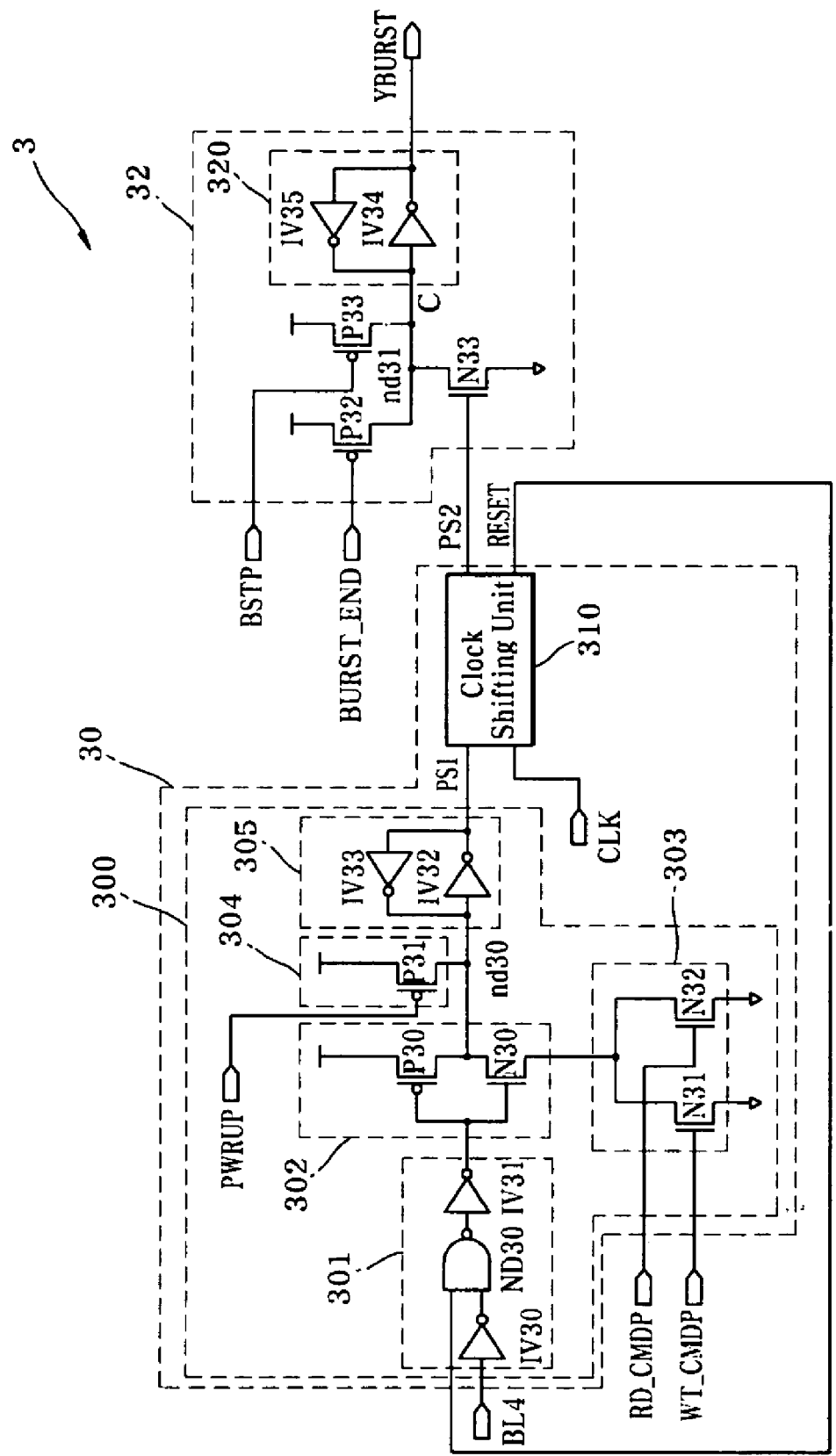
FIG. 3 is a circuit diagram illustrating a burst period signal generation unit included in the burst mode control circuit shown in FIG. 2.

The burst period signal generation unit 3 includes a pulse signal generation unit 30 and a signal driving unit 32 as shown in FIG. 3. The pulse signal generation unit 30 includes a first pulse signal generation unit 300 and a clock shifting unit 310. The detailed configuration of the burst period signal generation unit 3 is as follows.

The first pulse generation unit 300 includes a logic unit 301, a driving unit 302, a driving control unit 303, an initializing unit 304 and a latch unit 305. The logic unit 301 includes a NAND gate ND30 and an inverter IV31 which perform a logic AND operation on an inverted signal of a burst signal BL4, inputted to a high level when the burst length is set to 4, and a reset signal RESET inputted thereto. The driving unit 302 includes a PMOS transistor P30, which is turned on for pull-up driving when the output signal from the logic unit 301 is at a low level, and a NMOS transistor N30, which is turned on for pull-down driving when the output signal from the logic unit 301 is at a high level. The driving control unit 303 includes a NMOS transistor N31 which is turned on when a high level pulse of the read command RD_CMD is inputted and a NMOS transistor N32 which is turned on when a high level pulse of the write command WT_CMD is inputted. The initializing unit 304 includes a PMOS transistor P31 which initializes a node nd30 to a high level in response to a power up signal PWRUP which is at a low level in a power up period.

The first pulse signal generation unit 300 configured as described above generates a first pulse signal enabled to a high level in a case that the burst length is set to 8 or 16 with the reset signal RESET being inputted to a high level and the high level pulse of the read command RD_CMD or the write command WT_CMD is inputted. Meanwhile, the first pulse signal generation unit 300 generates the first pulse signal PS1 at a low level when the burst length is set to 4 or when the reset signal RESET at a low level is inputted.

Figure 4:
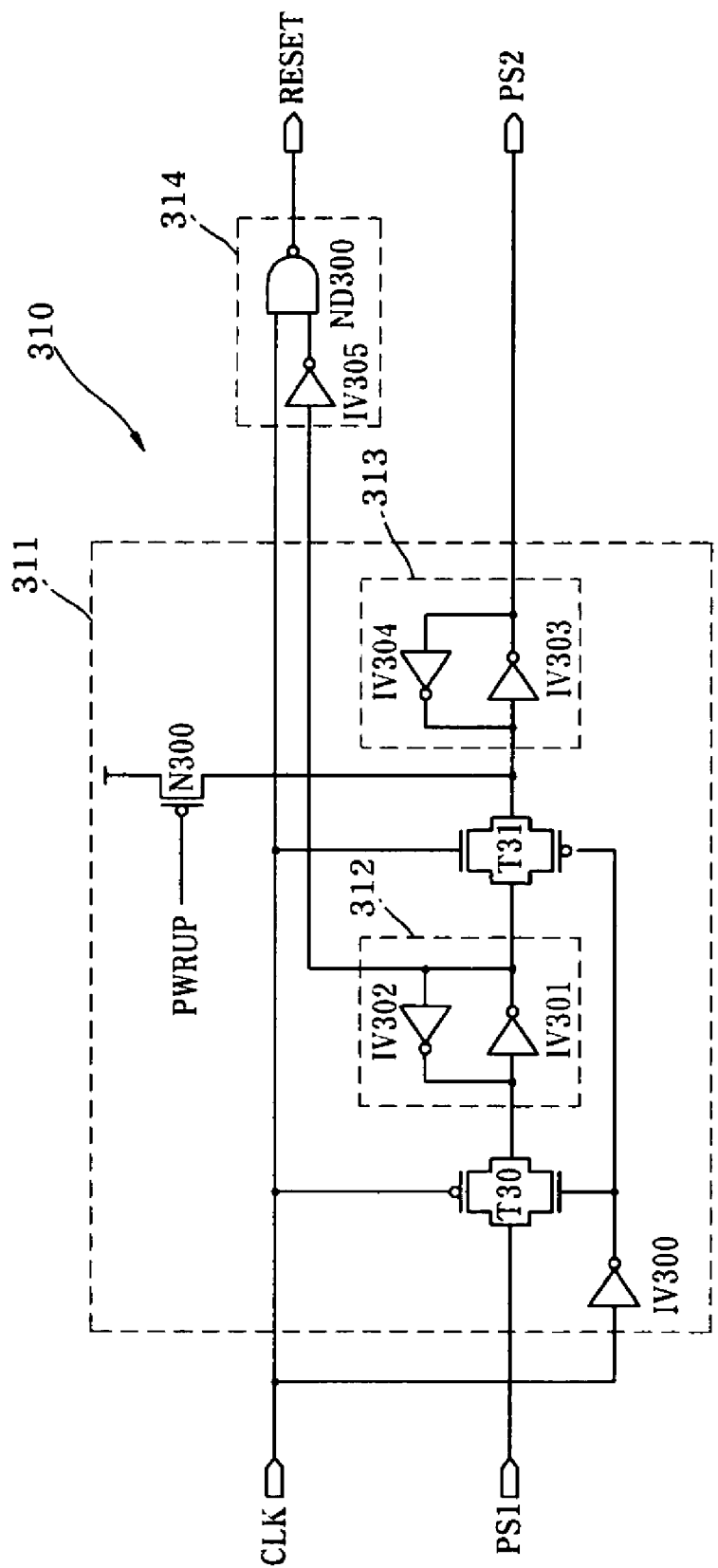
FIG. 4 is a circuit diagram illustrating a clock shifting unit included in the burst period signal generation unit shown in FIG. 3.

The clock shifting unit 310 includes a pulse output unit 311 and a reset signal output unit 314 as shown in FIG. 4. The pulse output unit 311 includes a transfer gate T30 which transfers the first pulse signal PS1 at a falling edge (shifted from a high level to a low level) of the clock signal CLK, a latch unit 312 which latches the output signal from the transfer gate T30, a transfer gate T31 which transfers the output signal from the latch unit 312 at a rising edge (shifted from a low level to a high level) of the clock signal CLK, and a latch unit 313 which latches the output signal from the transfer gate T31 and outputs a second pulse signal PS2. The reset signal output unit 314 buffers the output signal from the latch unit 312 to output the buffered signal as a reset signal RESET when the clock signal CLK of a high level is inputted.

The clock shifting unit 310 configured as described above generates, when the first pulse signal PS1 is enabled to a high level, the second pulse signal PS2 enabled to a high level and a reset signal RESET enabled to a low level after a period corresponding to one cycle of the clock signal CLK is elapsed. Since the reset signal RESET enabled to a low level is fed back to the first pulse signal generation unit 300 to disable the first pulse signal to a low level, high level pulse widths of the first pulse signal PS1 and the second pulse signal PS2 generated by shifting the first pulse signal PS1 are determined to one cycle of the clock signal CLK.

The signal driving unit 32 includes a PMOS transistor P32 which operates as a pull-up device pull-up driving a node nd31 in response to a burst end signal BURST_END, a PMOS transistor P33 which operates as a pull-up device pull-up driving the node nd31 in response to the interrupt end pulse BSTP, and a latch unit 320 which latches a signal of the node nd31 to output the latched signal as a burst period signal YBURST. Here, the burst end signal BURST_END is a signal generated to a low level pulse after a burst mode operation period is ended, and is a signal supported by a specification in the LPDDR2. This burst end signal BURST_END is not generated to a low level pulse when the burst length is set to 4, and is generated to a low level pulse after three cycle periods of the clock signal CLK are elapsed from the input of the pulses of the read command RD_CMDP and the write command WT_CMDP when the burst length is set to 8, and is generated to a low level pulse after seven cycle periods of the clock signal CLK are elapsed from the input of the pulses of the read command RD_CMDP and the write command WT_CMDP when the burst length is set to 16. Also, the interrupt end pulse BSTP is a signal generated to pause a burst mode by an interrupt.

The signal driving unit 32 configured as described above enables the burst period signal YBURST to a high level in response to the high level pulse of the second pulse signal PS2, and disables the burst period signal YBURST to a low level in the period when the low level pulse of the burst end signal BURST_END is inputted. Therefore, the burst period signal YBURST is generated to a signal enabled to a high level in the burst mode operation period.

Figure 5:
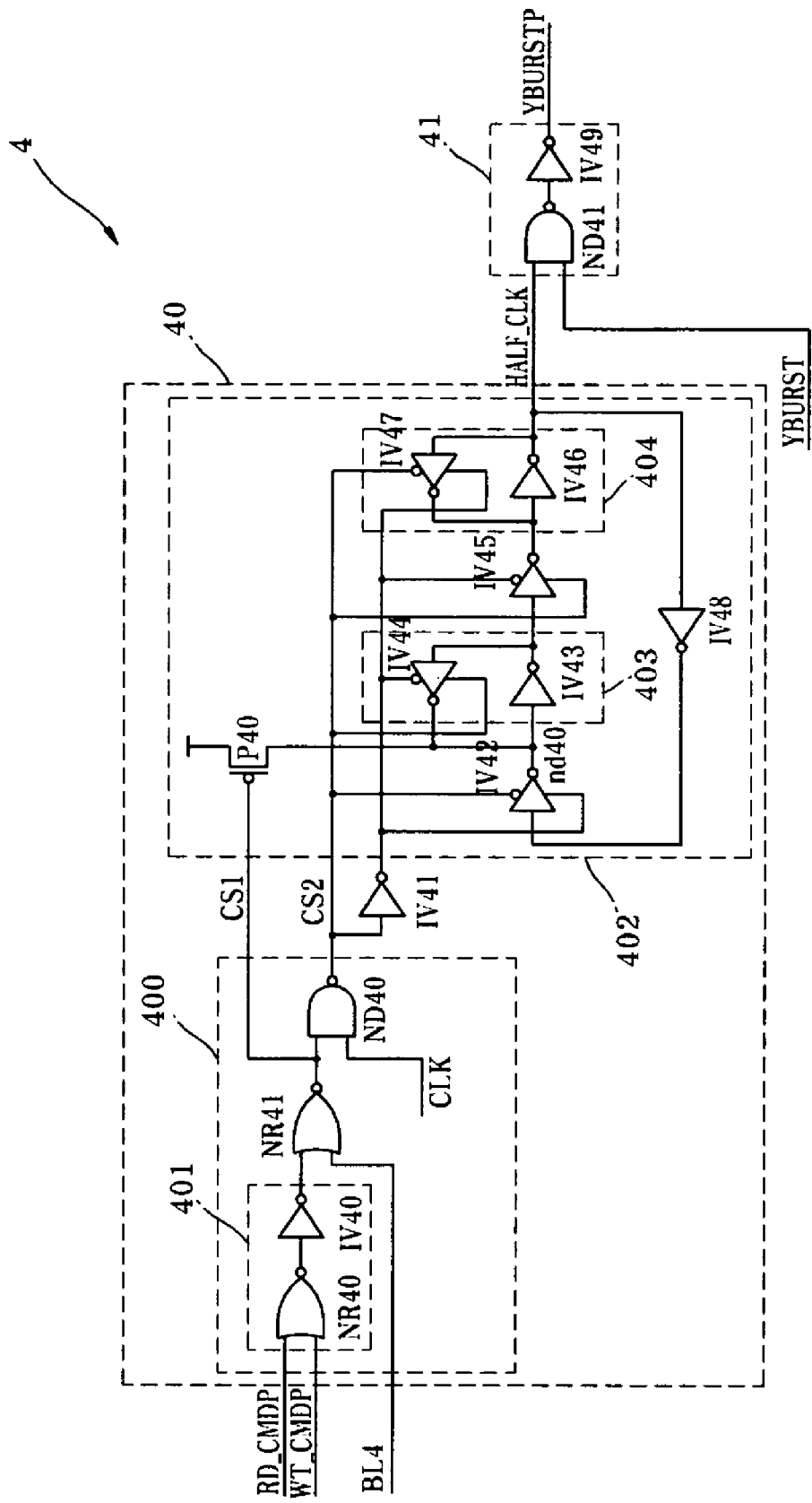
FIG. 5 is a circuit diagram illustrating a burst pulse generation unit included in the burst mode control circuit shown in FIG. 2.
Figure 6:
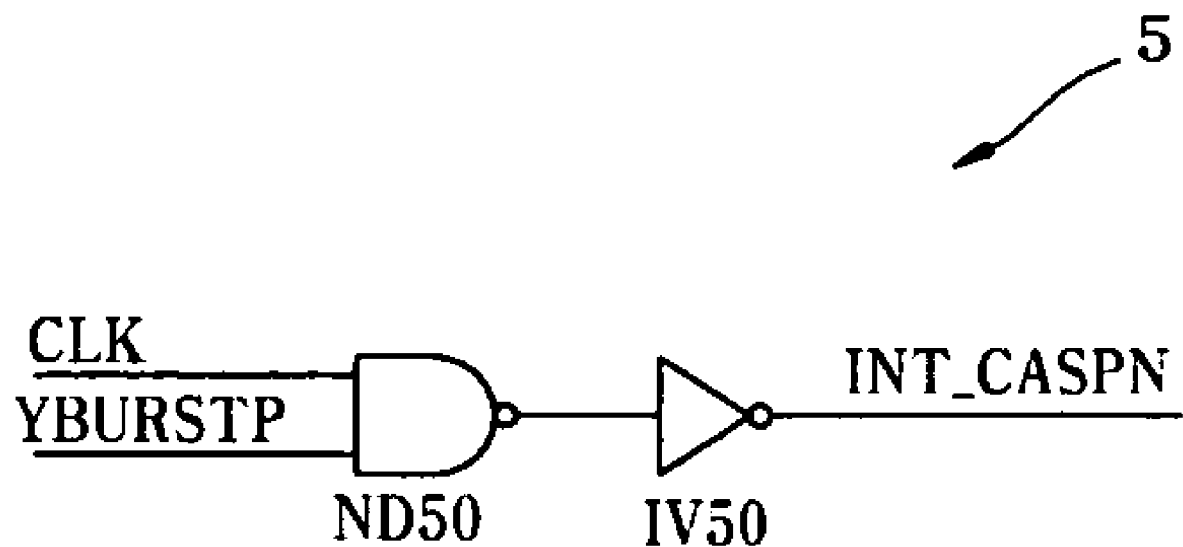
FIG. 6 is a circuit diagram illustrating a column access signal generation unit included in the burst mode control circuit shown in FIG. 2.

The burst pulse generation unit 4 includes an internal clock generation unit 40 and a buffer unit 41 as shown in FIG. 5. The internal clock generation unit 40 includes a control signal generation unit 400 and an oscillator 402. Hereinafter, the configuration of the burst pulse generation unit 4 will be described in more detail.

The control signal generation unit 400 includes a logic unit 401 which performs a logic OR operation on the read command RD_CMDP and the write command WT_CMDP inputted thereto, a NOR gate NR41 which performs a logic NOR operation on the burst signal BL4 and the output signal of the logic unit 401 inputted thereto to generate a first control signal CS1, and a NAND gate ND40 which performs a logic NAND operation on the clock signal CLK and the output signal of the NOR gate NR41 to generate a second control signal CS2. The control signal generation unit 400 configured as described above generates, when a high level pulse of the read command RD_CMDP or the write command WT_CMDP is inputted, the first control signal CS1 enabled to a low level and the second control signal CS2 enabled to a high level.

The oscillator 402 includes a PMOS transistor which drives a node nd40 to a high level, inverters IV42, IV45 which are driven when the second control signal at a low level is inputted, latch units 403, 404 and an inverter IV48. The oscillator 402 configured as described above drives the node nd40 to a high level by the first control signal CS1 generated to a low level when the high level pulse of the read command RD_CMDP or the write command WT_CMDP is inputted, and performs an oscillating operation to generate an internal clock HALF_CLK when the first control signal CS1 is disabled to a high level and the second control signal is enabled to a low level after the high level pulse of the read command RD_CMDP or the write command WT_CMDP is inputted. Here, the internal clock HALF_CLK is generated to a signal having a cycle period twice of the cycle of the clock signal CLK by controlling sizes of the inverters IV42, IV43, IV45, IV46, IV48 configuring the oscillator.

The buffer unit 41 includes a NAND gate ND41 and an inverter IV49 which perform a logic AND operation on the burst period signal YBURST and the internal clock HALF_CLK inputted thereto. The buffer unit 41 configured as described above buffers the internal clock HALF_CLK to output the buffered clock as the burst pulse YBURSTP in a period where the burst period signal YBURST is at a high level.

The column access signal generation unit 5 includes a NAND gate ND50 and an inverter IV50 which perform a logic AND operation on the clock signal CLK and the burst period signal YBURST inputted thereto. The column access signal generation unit 5 configured as described above buffers the burst pulse YBURSTP to output the buffered pulse as a column access signal INT_CASPN in a period where the clock signal CLK is at a high level.

An operation of the burst mode control circuit of the present embodiment configured as described above configured as described above will be described, and a case that the burst length is set to 16 is exemplarily explained hereinafter with reference to FIG. 7.

First, when the external commands CMD<0:3> having a combination for performing a read operation are inputted, the internal command generation unit 2 generates a high pulse of the read command RD_CMDP in a t1 period.

Next, the burst period signal generation unit 3 receives the read command RD_CMDP, the burst end signal BURST_END and the burst signal BL4 and generates the burst period signal YBURST enabled to a high level in the burst mode operation period. The operation of the burst period signal generation unit 3 will be described in more detail with reference to FIGS. 3 and 4.

Referring to FIGS. 3 and 4, the first pulse signal generation unit 300 receives the high pulse of the read command RD_CMDP to enable the first pulse signal PS1 to a high level in the t1 period. When the first pulse signal PS1 is enabled to a high level, the clock shifting unit 310 generates the second pulse signal PS2 which is enabled to a high level in a t2 period and generates the reset signal RESET which is enabled to a low level in the t2 period. Since the first pulse signal generation unit 300 disables the first pulse signal PS1 to a low level when the reset signal RESET is enabled to a low level, a width of the enabled period of the first pulse signal PS1 becomes one cycle period of the clock signal CLK, i.e. t1~t2 periods. Also, since the clock shifting unit 310 receives the first pulse signal PS1 to disable the second pulse signal PS2 to a low level, a width of the enabled period of the second pulse signal PS2 becomes one cycle period of the clock signal CLK, i.e. t2~t3 periods. Consequently, the second pulse signal is generated as a signal which is shifted from the first pulse signal PS1 by one cycle period of the clock signal CLK.

When the second pulse signal PS2 at a high level is applied during the t2~t3 periods, the signal driving unit 32 generates the burst period signal YBURST which is enabled to a high level in the t2 period. Also, the signal driving unit 32 receives the burst end signal BURST_END which is generated as a low level pulse after seven cycle periods of the clock signal CLK is elapsed from the input of the high level pulse of the read command RD_CMDP, and generates the burst period signal YBURST which is disabled to a low level. Therefore, when the burst length is set to 16, the burst period signal YBURST outputted from the signal driving unit 32 is maintained at a high level until seven cycle periods of the clock signal CLK is elapsed from the period when the high level pulse of the read command RD_CMDP is inputted. In other words, the burst period signal YBURST is enabled to a high level from the t1 period to a t8 period.

Next, the burst pulse generation unit 4 receives the read command RD_CMDP, the burst signal BL4 and the burst period signal and generates the burst pulse. An operation of the burst pulse generation unit 4 will be described in more detail with reference to FIG. 5.

Referring to FIG. 5, the control signal generation unit 400 receives the high pulse of the read command RD_CMDP and generates the first control signal CS1 enabled to a low level and the second control signal CS2 disabled to a high level. Since the first control signal CS1 at a low level turns on the PMOS transistor P40 to drive the node nd40 to a high level and the second control signal CS2 at a high level stops the driving of the inverters IV42, IV45, the oscillator does not perform the oscillating operation. After the high level pulse of the read command RD_CMDP is inputted, the first control signal CS1 is disabled to a high level and the second control signal is enabled to a low level. Therefore, the oscillator 402 performs the oscillating operation to generate the internal clock HALF_CLK having a cycle twice of the cycle of the clock signal CLK. The buffer unit 41 buffers the internal clock HALF_CLK to output the buffered clock as a burst pulse YBURSTP in a period where the burst period signal is at a high level.

Next, the column access signal generation unit 5 buffers the burst pulse YBURSTP to output the buffered pulse as the column access signal INT_CASPN in a period where the clock signal CLK is at a high level. Therefore, a first pulse of the column access signal INT_CASPN is generated in the t3 period, a second pulse in the t5 period, and a third pulse in the t7 period. In the case that 4-bit prefetch is applied, since data of 4 bits is inputted or outputted at every pulse of the column access signal INT_CASPN, data of 16 bits is continuously outputted upon the read operation.

As is apparent from the above description, the burst mode control circuit of the present embodiment generates the burst period signal YBURST which is enabled to a high level in the burst mode operation period, generates the internal clock HALF_CLK which is generated every predetermined number of cycles using the oscillator 402 in the period where the burst period signal YBURST is at a high level, and generates the pulse of the column access signal INT_CASPN from the internal clock HALF_CLK. As such, the burst mode control circuit of the present embodiment facilitates the realization of the circuit and reduces current consumption by using the oscillator 402, capable of reducing use of the clock shifter, to generate the pulse of the column access signal INT_CASPN.

While the present invention has been described with respect to the specific embodiments, it will be apparent to those skilled in the art that various changes and modifications may be made without departing from the spirit and scope of the invention as defined in the following claims.

This disclosure claims priority to Korean patent application number 10-2009-0002256, filed on Jan. 12, 2009, the entire contents of which are incorporated herein by reference.

What is claimed is:

1. A burst mode control circuit, comprising:
   a burst period signal generation unit for generating a burst period signal which is enabled during a burst mode operation period;
   a burst pulse generation unit for generating a burst pulse, which is generated at each of predetermined cycles in the enabled period of the burst period signal, in response to a read command and a write command; and
   a column access signal generation unit configured to receive the burst pulse and a clock signal and generate a column access signal which controls input and output of data during the burst mode operation period.

2. The burst mode control circuit of claim 1, wherein the burst period signal generation unit includes:
   a pulse signal generation unit for shifting a first pulse signal, which is generated with a predetermined pulse width when the read command or the write command is inputted, in response to the clock signal to generate a second pulse signal; and
   a signal driving unit for driving the burst period signal in response to the second pulse signal and a burst end signal.

3. The burst mode control circuit of claim 2, wherein the pulse signal generation unit includes:
   a first pulse signal generation unit for generating the first pulse signal in response to the read command and the write command; and
   a clock shifting unit for shifting the first pulse signal in response to the clock signal to generate the second pulse signal and a reset signal.

4. The burst mode control circuit of claim 3, wherein the first pulse signal is enabled when a pulse of the read command or the write command is inputted and disabled when the reset signal is enabled.

5. The burst mode control circuit of claim 3, wherein the first pulse signal generation unit includes:
   a logic unit for performing a logic operation on the reset signal and the burst signal inputted thereto;
   a driving unit for driving a first node in response to an output signal from the logic unit;
   a driving control unit for controlling the driving of the driving unit in response to the read command and the write command; and
   a latch unit connected between the first node and a second node from which the second pulse signal is outputted.

6. The burst mode control circuit of claim 5, wherein the first pulse signal generation unit further includes:
   an initializing unit for initializing the first node in response to a power up signal.

7. The burst mode control circuit of claim 3, wherein the clock shifting unit includes:
   a pulse output unit for shifting the first pulse signal by an integer number of cycles of the clock signal to output a shifted signal as the second pulse signal; and
   a reset signal output unit for outputting the reset signal which is enabled after the first pulse signal is enabled and a period corresponding to the integer number of cycles of the clock signal is elapsed.

8. The burst mode control circuit of claim 7, wherein the pulse output unit includes:
   a first transfer gate for transferring the first pulse signal in response to the clock signal;
   a first latch unit for latching an output signal from the first transfer gate;
   a second transfer gate for transferring an output signal from the first latch unit in response to the clock signal; and
   a second latch unit for latching an output signal from the second transfer gate.

9. The burst mode control circuit of claim 8, wherein the pulse output unit further includes: an initializing device for initializing an output node of the second transfer gate in response to the power up signal.

10. The burst mode control circuit of claim 8, wherein the reset signal output unit buffers an output signal from the first latch unit in response to the clock signal and outputs a buffered signal as the reset signal.

11. The burst mode control circuit of claim 8, wherein the signal driving unit includes:
    a pull-down device for pull-down driving the first node in response to the second pulse signal; and
    a first pull-up device for pull-up driving the first node in response to the burst end signal.

12. The burst mode control circuit of claim 11, wherein the signal driving unit further includes:
    a latch unit connected between the first node and a second node to latch a signal at the first node and output the latched signal as the burst period signal; and
    a second pull-up device for pull-up driving the first node in response to an interrupt end pulse for pausing the burst mode by an interrupt.

13. The burst mode control circuit of claim 2, wherein the burst period signal is enabled when a pulse of the second pulse signal is inputted and disabled when a pulse of the burst end signal is inputted.

14. The burst mode control circuit of claim 13, wherein the pulse of the burst end signal is generated in a period when the burst mode is ended.

15. The burst mode control circuit of claim 1, wherein the burst pulse generation unit includes:
    an internal clock generation unit for performing an oscillating operation in response to the clock signal when a pulse of the read command or the write command is inputted, to generate an internal clock having a predetermined cycle; and
    a buffer unit for buffering the internal clock in response to the burst period signal and outputting the buffered clock as the burst pulse.

16. The burst mode control circuit of claim 15, wherein the internal clock generation unit includes:
    a control signal generation unit for receiving the read command, the write command and a second control signal; and
    an oscillator for oscillating a signal of a node, which is driven in response to a first control signal, in response to the second control signal to generate the internal clock.

17. The burst mode control circuit of claim 16, wherein the control signal generation unit includes:
    a logic unit for performing a logic operation on the read command and the write command inputted thereto;

a first logic device for performing a logic operation on an output signal from the logic unit and the burst signal inputted thereto to generate the first control signal; and a second logic device for performing a logic operation on an output signal from the first logic device and the clock signal inputted thereto to generate the second control signal.

18. The burst mode control circuit of claim 16, wherein the first control signal is enabled in a period where the pulse of the read command or the write command is inputted, and the second control signal is enabled after the pulse of the read command or the write command is inputted.

19. The burst mode control circuit of claim 1, wherein the column access signal generation unit buffers the burst pulse in response to the clock signal and outputs the buffered pulse as the column access signal.

20. A burst mode control circuit, comprising:
   a burst pulse generation unit for generating a burst pulse, which includes a pulse generated at every predetermined number of cycles during a burst mode operation period; and
   a column access signal generation unit for receiving the burst pulse and a clock signal and generating a column access signal which controls input and output of data during the burst mode operation period.

21. The burst mode control circuit of claim 20, wherein the burst pulse generation unit includes:
   an internal clock generation unit for performing an oscillating operation in response to the clock signal when a pulse of a read command or write command is input, to generate an internal clock having a predetermined cycle; and
   a buffer unit for buffering the internal clock in response to the burst period signal to output the buffered clock as the burst pulse.

22. The burst mode control circuit of claim 21, wherein the internal clock generation unit includes:
   a control signal generation unit for receiving the read command, the write command and a second control signal; and
   an oscillator for oscillating a signal of a node, which is driven in response to a first control signal, in response to the second control signal to generate the internal clock.

23. The burst mode control circuit of claim 22, wherein the control signal generation unit includes:
   a logic unit for performing a logic operation on the read command and the write command inputted thereto;
   a first logic device for performing a logic operation on an output signal from the logic unit and the burst signal inputted thereto to generate the first control signal; and
   a second logic device for performing a logic operation on an output signal from the first logic device and the clock signal inputted thereto to generate the second control signal.

24. The burst mode control circuit of claim 22, wherein the first control signal is enabled in a period where the pulse of the read command or the write command is inputted, and the second control signal is enabled after the pulse of the read command or the write command is inputted.

25. The burst mode control circuit of claim 20, wherein the column access signal generation unit buffers the burst pulse in response to the clock signal and outputs the buffered pulse as the column access signal.

* * * * *